(12) United States Patent
Perng et al.

(10) Patent No.: US 11,508,843 B1
(45) Date of Patent: Nov. 22, 2022

(54) SEMICONDUCTOR DEVICE HAVING FULLY OXIDIZED GATE OXIDE LAYER AND METHOD FOR MAKING THE SAME

(71) Applicant: TAIWAN SEMICONDUCTOR MANUFACTURING COMPANY, LTD., Hsinchu (TW)

(72) Inventors: Tsu-Hsiu Perng, Hsinchu (TW); Yun-Chi Wu, Hsinchu (TW); Chia-Chen Chang, Hsinchu (TW); Cheng-Bo Shu, Hsinchu (TW); Jyun-Guan Jhou, Hsinchu (TW); Pei-Lun Wang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/332,002

(22) Filed: May 27, 2021

(51) Int. Cl.
| | |
|---|---|
| H01L 21/00 | (2006.01) |
| H01L 29/78 | (2006.01) |
| H01L 29/06 | (2006.01) |
| H01L 21/02 | (2006.01) |
| H01L 29/66 | (2006.01) |

(52) U.S. Cl.
CPC ...... *H01L 29/7816* (2013.01); *H01L 21/0214* (2013.01); *H01L 21/0223* (2013.01); *H01L 29/0611* (2013.01); *H01L 29/66681* (2013.01)

(58) Field of Classification Search
CPC ............. H01L 29/7816; H01L 21/0214; H01L 21/0223; H01L 29/0611; H01L 29/66681
See application file for complete search history.

(56) References Cited

U.S. PATENT DOCUMENTS

| | | | | |
|---|---|---|---|---|
| 4,851,370 A | * | 7/1989 | Doklan | H01L 21/02271 438/770 |
| 2002/0083959 A1 | * | 7/2002 | Morita | H01L 29/518 438/723 |
| 2004/0224531 A1 | * | 11/2004 | You | H01L 21/0223 438/774 |

* cited by examiner

*Primary Examiner* — Richard A Booth
(74) *Attorney, Agent, or Firm* — Birch, Stewart, Kolasch & Birch, LLP

(57) ABSTRACT

A method for making a semiconductor device includes forming a ROX layer on a substrate and a patterned silicon oxynitride layer on the patterned ROX layer; conformally forming a dielectric oxide layer to cover the substrate, the patterned silicon oxynitride layer, and the patterned ROX layer; and fully oxidizing the patterned silicon oxynitride layer to form a fully oxidized gate oxide layer on the substrate.

20 Claims, 11 Drawing Sheets

US 11,508,843 B1

SEMICONDUCTOR DEVICE HAVING FULLY OXIDIZED GATE OXIDE LAYER AND METHOD FOR MAKING THE SAME

BACKGROUND

With the ease of integration and compatibility with a control circuitry, laterally diffused metal-oxide-semiconductor (LDMOS) devices are widely used as power devices in Bipolar CMOS-DMOS (BCD) technology. Power consumption is one of the major concerns in LDMOS devices. It is desirable to design a power LDMOS to achieve higher breakdown voltage (BV) while minimizing specific on-resistance (Rdson) in order to reduce conduction loss. An ultra-low Rdson is desirable for quick-charging devices so as to achieve high current capacity.

Oxidation of a thin drift region by a reduced surface field oxide (RESURF oxide, ROX) process is introduced to obtain an optimal BV-Rdson trade-off alongside a reduced surface field (RESURF), an improved electrical safe operating area (SOA), and a reduced hot-carrier injection (HCI). However, in the most current technology, the ROX process is yet to be optimized in real devices. A local oxidation of silicon (LOCOS) technique is usually used to form ROX. However, a device scalability is limited by field oxides (FOXs) (LOCOS features).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
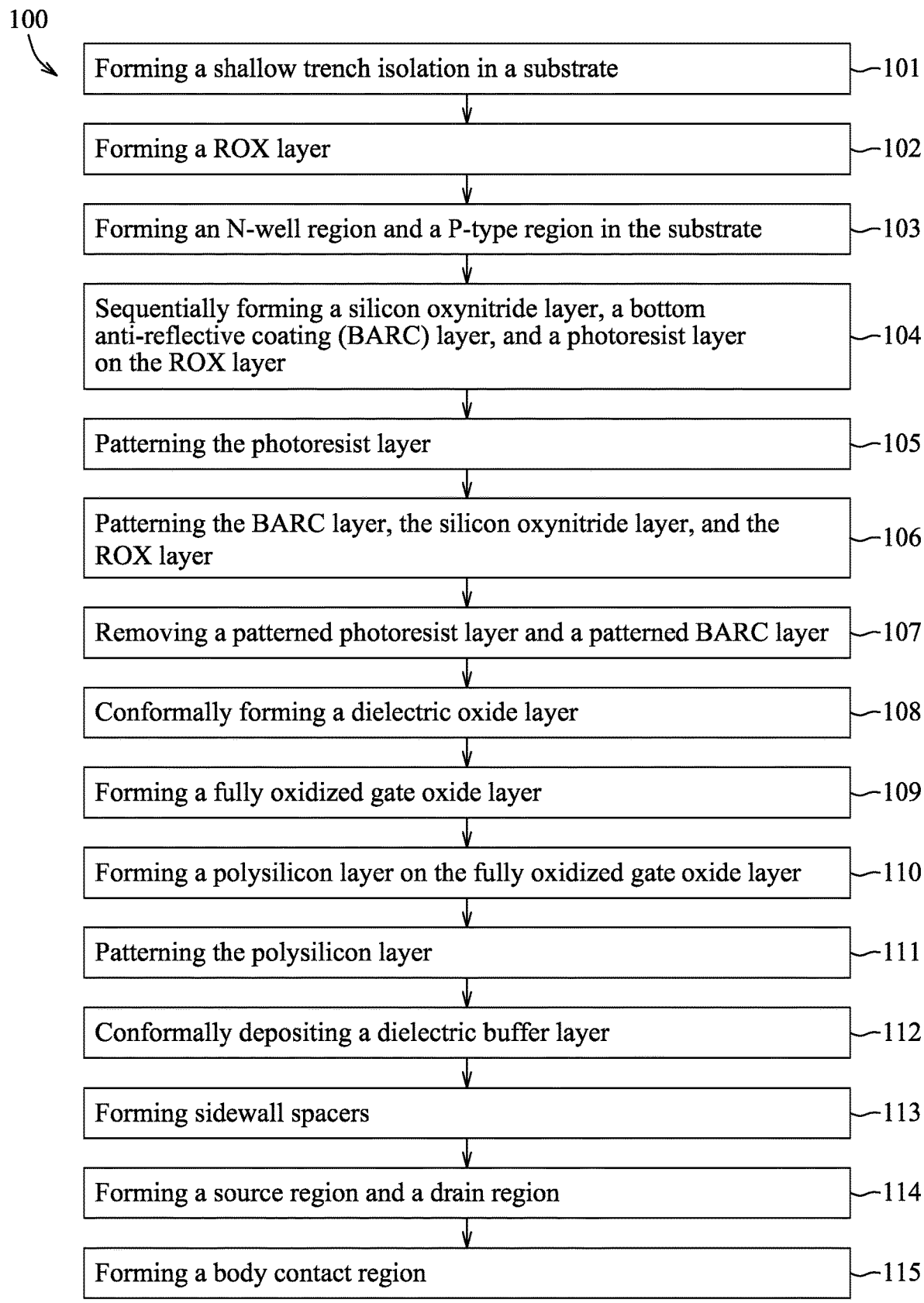
FIG. 1 is a flow diagram illustrating a method for manufacturing a semiconductor device.
Figure 2:
FIGS. 2 to 21 illustrate schematic views showing intermediate stages of the method depicted in FIG. 1.
Figure 3:
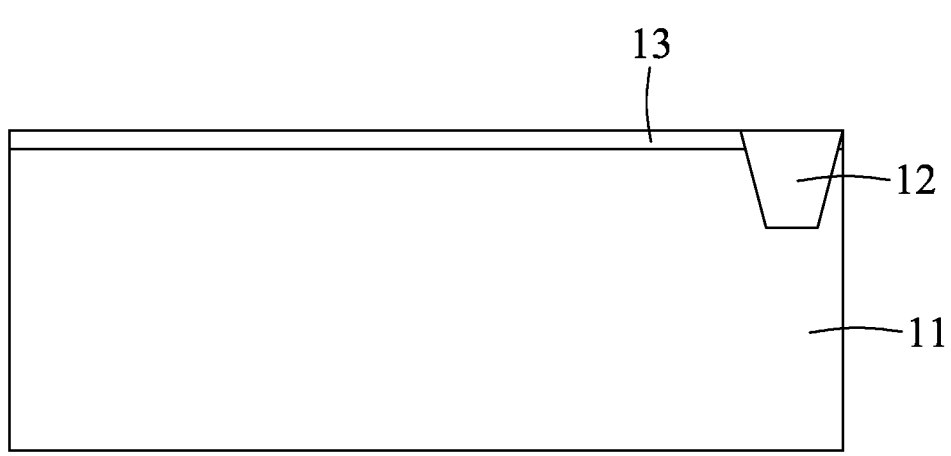
Figure 4:
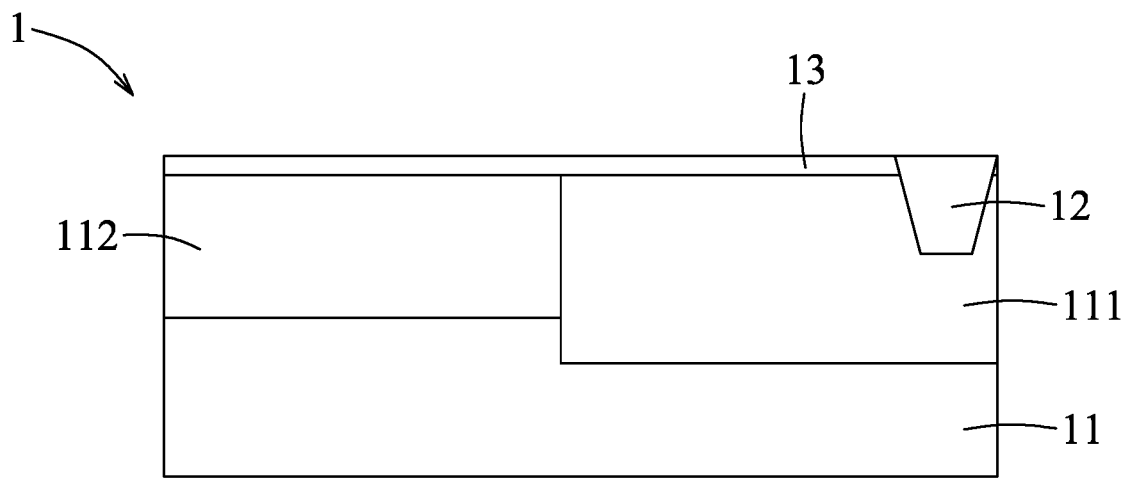
Figure 5:
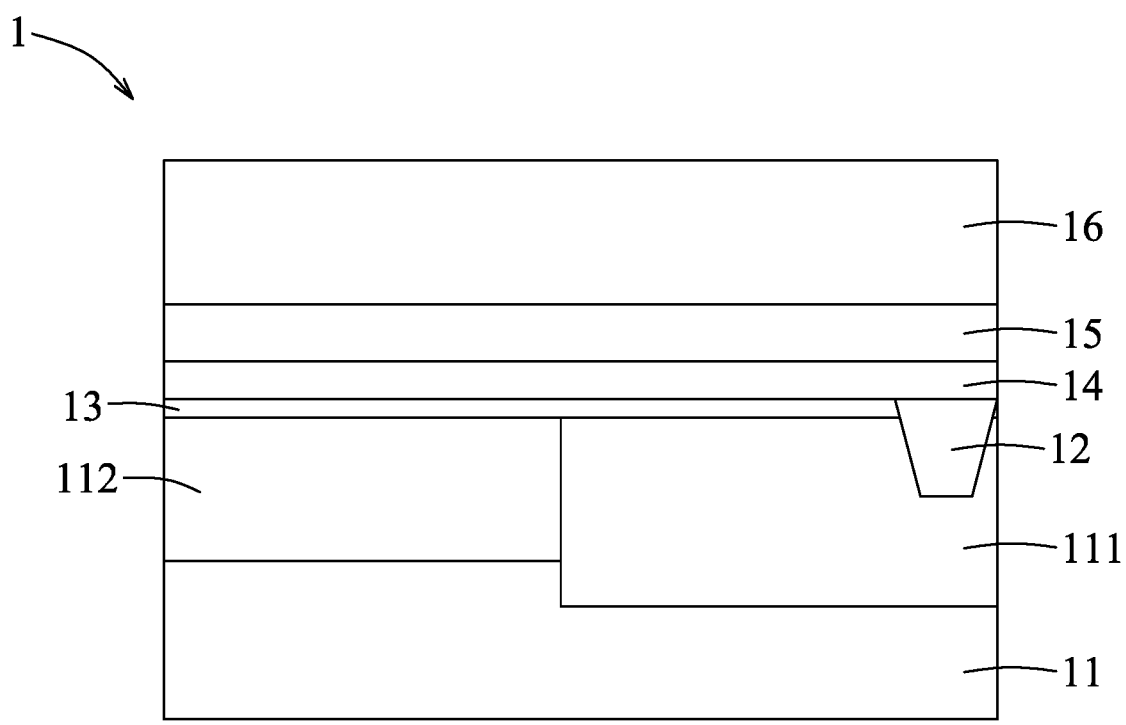
Figure 6:
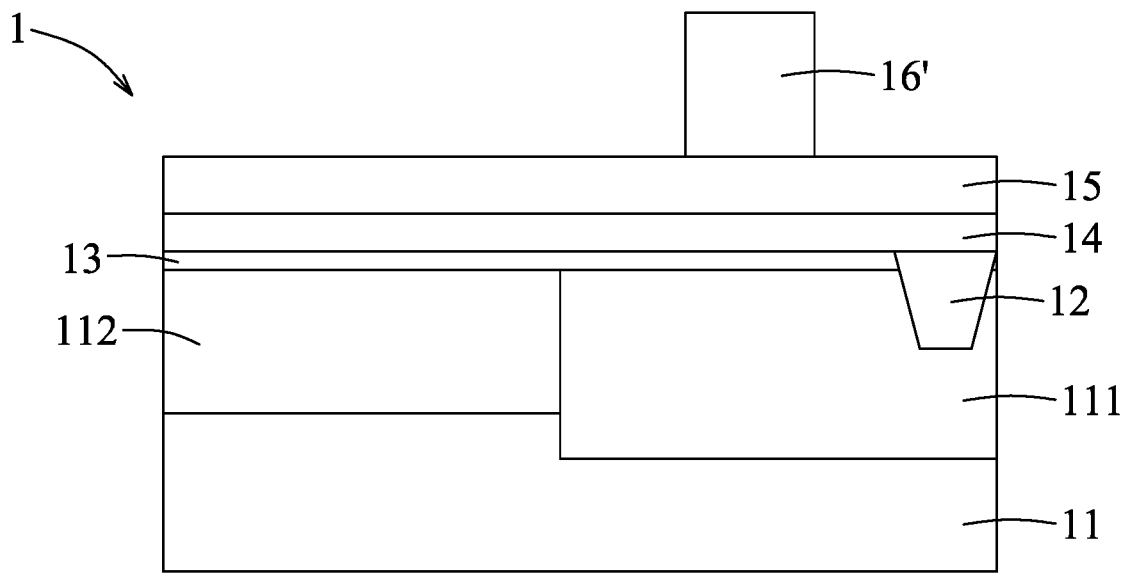
Figure 7:
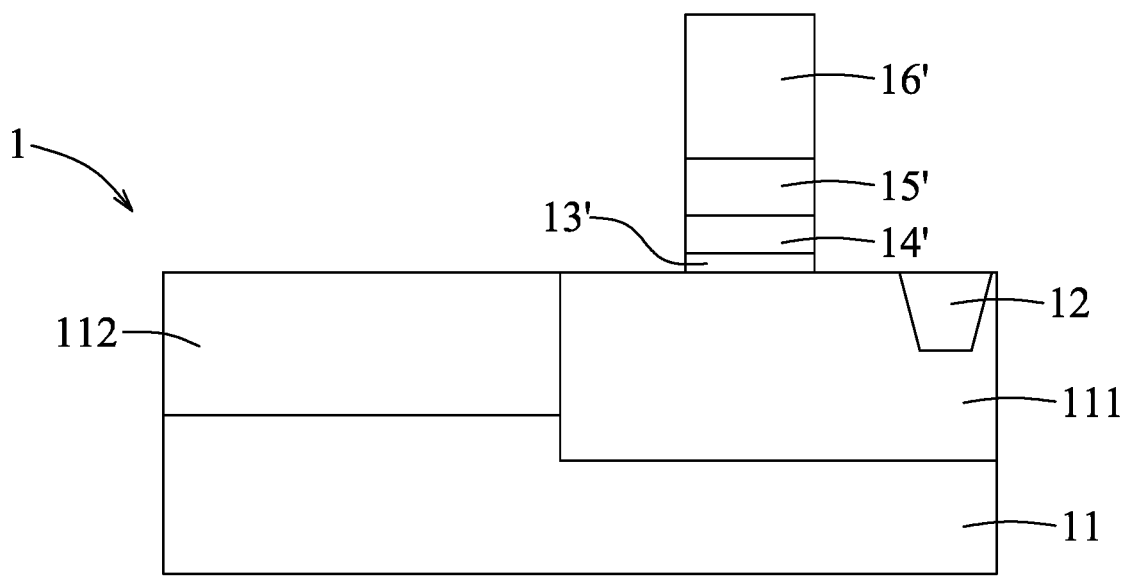
Figure 8:
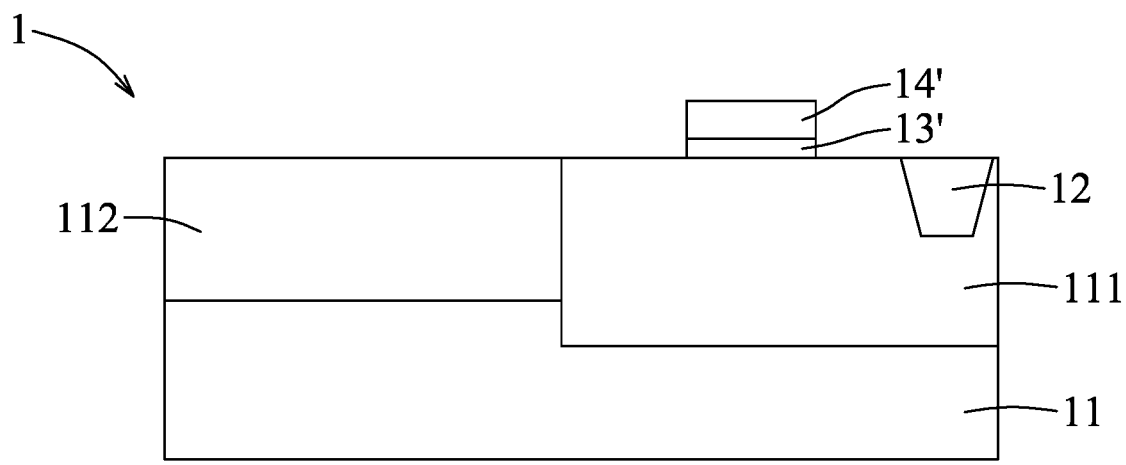
Figure 9:
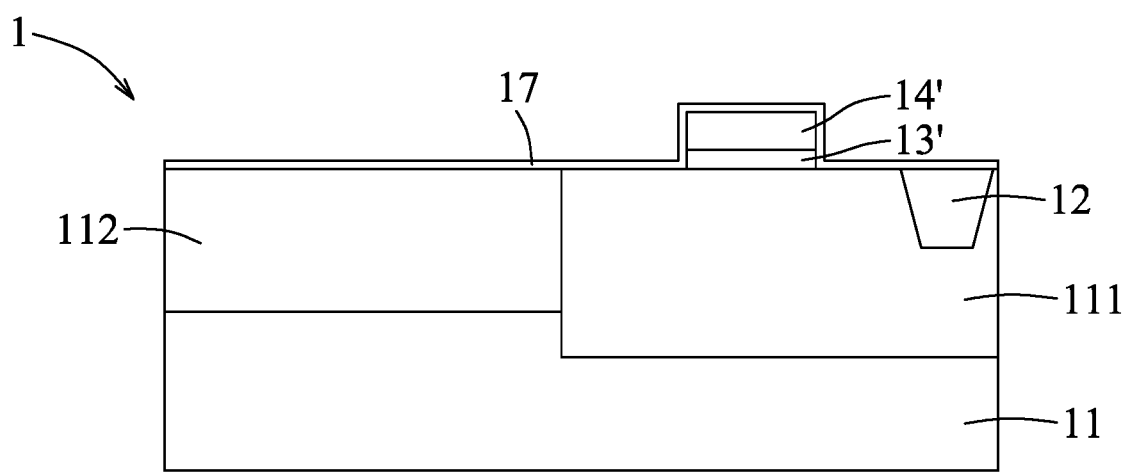
Figure 10:
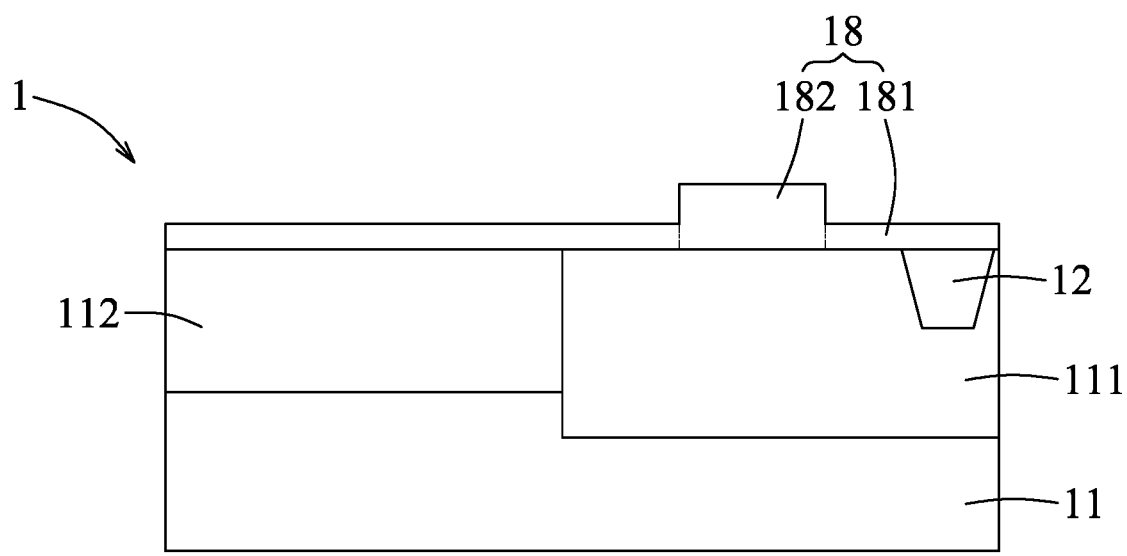

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "over," "upwardly," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a method 100 for manufacturing a semiconductor device having a fully oxidized gate oxide layer in accordance with some embodiments. FIGS. 2 to 21 illustrate schematic views of a semiconductor device 1 having a fully oxidized gate oxide layer during various stages of the method 100 of FIG. 1. The semiconductor device 1 will be configured as an N-channel LDMOS device in the illustrated embodiments. Other suitable configurations for the semiconductor device 1 are within the contemplated scope of the present disclosure. For example, in some embodiments, the semiconductor device 1 may be configured as a P-channel LDMOS device. The method 100 and the semiconductor device 1 are collectively described below. However, additional steps can be provided before, after or during the various stages of the method 100, and some of the steps described herein may be replaced by other steps or be eliminated. Similarly, further additional features may be present in the semiconductor device 1, and/or features present may be replaced or eliminated in additional embodiments.

Referring to FIG. 1, the method 100 begins at block 101, where a shallow trench isolation (STI) is formed in a substrate. Referring to the example illustrated in FIG. 2, a STI 12 is formed in a substrate 11 by patterning a trench in the substrate 11 to define an active region in which MOSFET is to be formed, and filling the trench with an insulating material, for example, but not limited to, silicon oxide, silicon nitride, or silicon oxynitride. Other suitable insulating materials are within the contemplated scope of the present disclosure.

In some embodiments, the substrate 11 is made of elemental semiconductor materials, for example, but not limited to, crystalline silicon, diamond, or germanium; compound semiconductor materials, for example, but not limited to, silicon carbide, gallium arsenic, indium arsenide, or indium phosphide; or alloy semiconductor materials, for example, but not limited to, silicon germanium, silicon germanium carbide, gallium arsenic phosphide, or gallium indium phosphide. Other suitable materials are within the contemplated scope of the present disclosure. The substrate 11 may be a bulk silicon substrate, a silicon-on-insulator (SOI) substrate, or a germanium-on-insulator (GOI) substrate. In some embodiments, the substrate 11 includes a P-type substrate.

Referring to FIG. 1, the method 100 then proceeds to block 102, where a ROX layer is formed. Referring to the example illustrated in FIG. 3, a ROX layer 13 can be, for example, but not limited to, a silicon dioxide ($SiO_2$) layer which has a thickness ranging from 120 angstrom (Å) to 130 Å, and which can be grown using a thermal oxidation process or an in-situ steam generation (ISSG) process. In some embodiments, the ROX layer 13 is formed by oxidizing a top portion of the substrate 11 using the ISSG process. In some embodiments, the ISSG process includes introducing oxygen at a temperature ranging from 300° C. to 800° C., a pressure ranging from 5 Torr to 40 Torr, and a total gas flow ranging from 5 standard liters per minute (s.l.m.) to 50 s.l.m., and hydrogen at a $H_2$% ranging from 2% to 33%, for a process time ranging from 30 seconds to 10 minutes.

Referring to FIG. 1, the method 100 then proceeds to block 103, where an N-well region and a P-type region are formed in the substrate. Referring to the example illustrated in FIG. 4, an N-well region 111 and a P-type region 112 are formed in the substrate 11. The formation of the N-well region 111 may be performed before or after the formation of the P-type region 112. The N-well region 111 may be alternatively referred to as a power N-well, and may function as a drift region for the N-channel LDMOS device. The N-well region 111 may be formed by implanting an N-type doping material through a patterned photoresist layer (not shown). The N-type doping material for the N-well region 111 includes, for example, but not limited to, phosphorus, arsenic, nitrogen, antimony, or combinations thereof. Other suitable doping materials are within the contemplated scope of the present disclosure. The P-type region 112 may be alternatively referred to as a P-boy region, and may function as a channel region for the N-channel LDMOS device. The P-type region 112 may be formed by implanting an P-type doping material through another patterned photoresist layer (not shown). The P-type doping material for the P-type region 112 includes, for example, but not limited to, boron, gallium, aluminum, indium, or combinations thereof. Other suitable doping materials are within the contemplated scope of the present disclosure. In some embodiments, the P-type region 112 may be formed by a diffusion process.

Referring to FIG. 1, the method 100 then proceeds to block 104, where a silicon oxynitride (SiOxNy) layer, a bottom anti-reflective coating (BARC) layer, and a photoresist layer are sequentially formed on the ROX layer. Referring to the example illustrated in FIG. 5, a silicon oxynitride layer 14, a BARC layer 15, and a photoresist layer 16 are sequentially formed on the ROX layer 13. The silicon oxynitride layer 14 may be formed on the ROX layer 13 using a suitable deposition process as is known to those skilled in the art of semiconductor fabrication, for example, but not limited to, chemical vapor deposition (CVD), plasma-enhanced chemical vapor deposition (PECVD), atomic layer deposition (ALD), plasma-enhanced atomic layer deposition (PEALD), or spin-coating. Other suitable deposition processes are within the contemplated scope of the present disclosure. The silicon oxynitride layer 14 may have a thickness which depends on a deposition rate of the deposition process. In some embodiments, the thickness of the silicon oxynitride layer 14 may range from 160 Å to 200 Å. Other suitable thickness is within the contemplated scope of the present disclosure.

The BARC layer 15 is then deposited on the silicon oxynitride layer 14 using a suitable deposition process as is known to those skilled in the art of semiconductor fabrication, for example, but not limited to, CVD, PECVD, ALD, PEALD, or spin-coating. Other suitable deposition processes are within the contemplated scope of the present disclosure. The BARC layer 15 may have a thickness ranging from 500 Å to 600 Å. When the thickness of the BARC layer 15 is greater than 600 Å, an anti-reflection effect of the BARC layer 15 may be affected. The BARC layer may be made of an organic or inorganic material which can suppress unintended light reflection. In some embodiments, the BARC layer 15 may be made of a suitable organic material, for example, but not limited to, an organic polymer including carbon, oxygen, and/or nitrogen. Other suitable materials are within the contemplated scope of the present disclosure. The BARC layer 15 is used to prevent or reduce reflections during the patterning of the overlying photoresist layer 16. In addition, the BARC layer 15 may also act as a photoresist mask.

The photoresist layer 16 is then deposited on the BARC layer 15 using a suitable deposition process as is known to those skilled in the art of semiconductor fabrication, for example, but not limited to, CVD, PECVD, ALD, PEALD, or spin-coating. Other suitable deposition processes are within the contemplated scope of the present disclosure. In some embodiments in which spin-coating is used to form the photoresist layer 16, a photoresist solution is dispensed onto a surface of the BARC layer 15, and then the semiconductor device 1 is spun rapidly until the photoresist solution is almost dried. In some embodiments, the photoresist layer 16 may be heated or baked at an elevated temperature ranging, for example, but not limited to, from 90° C. to 150° C., for a time period of, for example, but not limited to, several seconds, so as to evaporate the residual solvent in the photoresist layer 16 and to densify the photoresist layer 16. The photoresist layer 16 may have a thickness ranging from 1800 Å to 2000 Å. Other suitable thickness is within the contemplated scope of the present disclosure.

Referring to FIG. 1, the method 100 then proceeds to block 105, where the photoresist layer is patterned. Referring to the examples illustrated in FIGS. 5 and 6, the photoresist layer 16 is patterned through a pattern of a patterned mask (not shown) using well-known photolithographic processes, for example, but not limited to, high resolution deep ultraviolet (DUV) photolithography for optimum pattern resolution. In some embodiments, the photoresist layer 16 is exposed to light having a predetermined wavelength through the pattern of the patterned mask. The pattern of the patterned mask is thus transferred to the photoresist layer 16. The exposed photoresist layer 16 is then heated or baked at a temperature ranging, for example, but not limited to, from 70° C. to 150° C. for a time period, for example, but not limited to, from one minute to two minutes, so as to amplify the latent image and to cleave the photoresist. A developer is then applied to the photoresist layer 16. The exposure time of the photoresist layer 16 to the developer solution may be dependent on the composition of the developer solution. The developer solution may be, for example, an aqueous tetramethylammonium hydroxide (TMAH) solution. Other suitable developer solutions are within the contemplated scope of the present disclosure. The developer solution may be applied in a number of ways, for example, dripping the developer solution onto the photoresist layer 16, dipping the semiconductor device 1 into a developer solution bath, or spraying the developer solution onto the photoresist layer 16. The exposed photoresist layer 16, which is soluble in the developer solution, is then removed and a patterned photoresist layer 16' is thus formed. A rinsing process using de-ionized water e may be then performed to remove the dissolved photoresist. An optional baking process may be performed to remove any residual moisture on the patterned photoresist layer 16'.

Referring to FIG. 1, the method 100 then proceeds to block 106, where the BARC layer, the silicon oxynitride layer, and the ROX layer are patterned. Referring to the examples illustrated in FIGS. 6 and 7, the patterned photoresist layer 16' is then employed as an etch mask in an etch chamber to etch the BARC layer 15, the silicon oxynitride layer 14, and the ROX layer 13 using an anisotropic etching process, for example, but not limited to, a dry etching process, according to the pattern defined by the patterned photoresist layer 16' so as to form a patterned ROX layer 13' disposed on the N-well region 111 of the substrate 11, a patterned silicon oxynitride layer 14' disposed on the patterned ROX layer 13', and a patterned BARC layer 15' disposed on the patterned silicon oxynitride layer 14'.

Referring to FIG. 1, the method 100 then proceeds to block 107, where the patterned photoresist layer and the patterned BARC layer are removed. Referring to the examples illustrated in FIGS. 7 and 8, both the the patterned photoresist layer 16' and the patterned BARC layer 15' are removed by a suitable removal process as is known to those skilled in the art of semiconductor fabrication, for example, but not limited to, a wet strip process or a dry etch process (for example, a plasma ashing process). Other suitable removal processes are within the contemplated scope of the present disclosure.

Referring to FIG. 1, the method 100 then proceeds to block 108, where a dielectric oxide layer is conformally formed. Referring to the examples illustrated in FIGS. 8 and 9, a thin dielectric oxide layer 17, for example, but not limited to, a thin dielectric silicon oxide layer, is conformally formed to cover the patterned ROX layer 13', the patterned silicon oxynitride layer 14', the substrate 11, and the STI 12. The thin dielectric oxide layer 17 may be formed by using, for example, but not limited to, a rapid thermal oxidation (RTO) process. During the RTO process, the substrate 11 formed with the patterned ROX layer 13', the patterned silicon oxynitride layer 14', and the STI 12 is rapidly heated in a chamber to a temperature ranging, for example, but not limited to, from 900° C. to 1150° C. (typically at 1000° C.) by operation of a lamp as a heat source, according to preset operating parameters programmed into a temperature monitor and a control system. The substrate 11 formed with the patterned ROX layer 13', the patterned silicon oxynitride layer 14', and the STI 12 remains in the aforesaid high temperature range for a time period ranging, for example, but not limited to, from 1 minute to 2 minutes (typically for a time period from 90 seconds to 120 seconds). Simultaneously, gaseous oxygen is charged into the chamber through a gas entry opening and exits the chamber through a gas exit opening, such that the thin dielectric silicon oxide layer 17 is conformally formed to cover the patterned ROX layer 13', the patterned silicon oxynitride layer 14', the substrate 11, and the STI 12. The dielectric silicon oxide layer 17 thus formed has a thickness ranging, for example, but not limited to, from 10 Å to 20 Å. Other suitable thickness is within the contemplated scope of the present disclosure.

Referring to FIG. 1, the method 100 then proceeds to block 109, where a fully oxidized gate oxide layer is formed. Referring to the examples illustrated in FIGS. 9 and 10, the RTO process is further conducted in the chamber at the temperature ranging, for example, but not limited to, from 900° C. to 1150° C. (typically at 1000° C.) for a time period ranging, for example, but not limited to, from 1 minute to 2 minutes (typically for a time period from 90 seconds to 120 seconds) with continuous charge and discharge of the gaseous oxygen into and from the chamber through the gas entry opening and the gas exit opening, respectively, such that the patterned silicon oxynitride layer 14' is fully oxidized so as to form a fully oxidized gate oxide layer 18 on the substrate 11. The fully oxidized gate oxide layer 18 includes an input/output (I/O) oxide layer portion 181 and a fully oxidized ROX layer portion 182 integrated with the I/O oxide layer portion 181. A thickness ratio of the fully oxidized ROX layer portion 182 to the I/O oxide layer portion 181 is at least 1.5. In some embodiments, the thickness ratio of the fully oxidized ROX layer portion 182 to the I/O oxide layer portion 181 ranges from 2.0 to 2.5.

In a method for making a field oxide isolation structure for a semiconductor device such as a LDMOS device, a pad oxide layer is formed by thermally oxidizing a semiconductor substrate such as a silicon substrate, and a silicon nitride layer is deposited on the pad oxide. After the field oxide isolation structure is formed, the silicon nitride layer and the pad oxide layer are removed, respectively, usually by a wet etching process with hot phosphoric acid and an aqueous solution of hydrofluoric acid. Surface damages are usually formed on the substrate 11 due to the wet etching process using the aforesaid acids. In the present disclosure, the patterned silicon oxynitride layer 14' is fully oxidized to form the fully oxidized gate oxide layer 18 on the substrate 11. It should be noted that the method 100 of the present disclosure does not involve using the wet etching process with the phosphoric acid and the aqueous solution of hydrofluoric acid which are usually employed for removing the silicon nitride layer in the method for making the field oxide isolation structure. Therefore, the surface damages of the substrate 11 are totally avoided.

Referring to FIG. 1, the method 100 then proceeds to block 110, where a polysilicon layer is formed on the fully oxidized gate oxide layer. Referring to the example illustrated in FIG. 11, a polysilicon layer 19 is formed to have a suitable thickness on the fully oxidized gate oxide layer 18 by a suitable deposition process as is known to those skilled in the art of semiconductor fabrication, for example, but not limited to, CVD, ALD, high density plasma CVD (HDP-CVD), remote plasma CVD (RPCVD), PECVD, or PEALD. Other suitable deposition processes are within the contemplated scope of the present disclosure. In some embodiments, the polysilicon layer 19 may be formed by CVD using silane ($SiH_4$) as a chemical gas. In some embodiments, the polysilicon layer 19 may have a thickness ranging from 400 Å to 800 Å.

Referring to FIG. 1, the method 100 then proceeds to block 111, where the polysilicon layer is patterned. Referring to the examples illustrated in FIGS. 11 and 12, a hard mask layer (not shown) is patterned using photolithography and photoresist developing technology as known to those skilled in the art of semiconductor fabrication. For example, the hard mask layer may be patterned by using 193-nm immersion lithography or extreme ultraviolet (EUV) lithography. The pattern formed in the hard mask layer is then transferred to the polysilicon layer 19 by an etching process (for example, but not limited to, dry etching) so as to form at least one poly gate 19' disposed on the I/O oxide layer portion 181 and the fully oxidized ROX layer portion 182 of the fully oxidized gate oxide layer 18.

Referring to FIG. 1, the method 100 then proceeds to block 112, where a dielectric buffer layer is conformally deposited. Referring to the example illustrated in FIG. 13, a dielectric buffer layer 20, for example, but not limited to, a dielectric silicon oxide layer, is conformally deposited to cover the poly gate 19' and the fully oxidized gate oxide layer 18. The deposition of the dielectric buffer layer 20 may be performed using a suitable deposition process as is known to those skilled in the art of semiconductor fabrication, for example, but not limited to, CVD, PECVD, ALD, PEALD, ALD, or PEALD. Other suitable deposition processes are within the contemplated scope of the present disclosure. The dielectric buffer 120 thus formed has a thickness ranging, for example, but not limited to, from 10 Å to 20 Å. Other suitable thickness is within the contemplated scope of the present disclosure.

Referring to FIG. 1, the method 100 then proceeds to block 113, where sidewall spacers are formed. Referring to the example illustrated in FIG. 14, a plurality of sidewall spacers 21 are formed to extend upwardly from horizontal portions 201 of the dielectric buffer layer 20 and to laterally cover vertical portions 202 of the the dielectric buffer layer 20. In some embodiments, the sidewall spacers 21 are formed by conformally depositing a spacer layer on the dielectric buffer layer 20 and anisotropically etching the spacer layer to etch away horizontal portions of the spacer layer so as to form the sidewall spacers 21. The conformal deposition of the spacer layer may be performed using a suitable deposition process as is known to those skilled in the art of semiconductor fabrication, for example, but not limited to, CVD, PECVD, ALD, PEALD, ALD, or PEALD. Other suitable deposition processes are within the contemplated scope of the present disclosure. In some embodiments, the spacer layer may be made of a dielectric material, for example, but not limited to, silicon oxide, silicon nitride, silicon carbide, silicon oxycarbide, silicon oxynitride, silicon carbonitride, silicon oxycarbonitride, or combinations thereof. Other suitable dielectric materials are within the contemplated scope of the present disclosure.

Referring to FIG. 1, the method 100 then proceeds to block 114, where a source region and a drain region are formed. Referring to the example illustrated in FIG. 15, a source region 22 and a drain region 23 are formed in the P-type region 112 and the N-well region 111, respectively. The source region 22 is disposed adjacent to the poly gate 19', and the drain region 23 is disposed between the fully oxidized ROX layer portion 182 of the fully oxidized gate oxide layer 18 and the STI 12. In some embodiments, the source region 22 and the drain region 23 are formed simultaneously by doping the P-type region 112 and the N-well region 111 with an N-type dopant (N+), for example, but not limited to, phosphorous or arsenic, through a patterned photoresist layer (not shown) disposed over the substrate 11 for obtaining an N-channel LDMOS device. The patterned photoresist layer is removed after the source region 22 and the drain region 23 are formed. In some embodiments, the the source region 22 and the drain region 23 may have different structures, for example, but not limited to, raised, recessed, or strained features.

Referring to FIG. 1, the method 100 then proceeds to block 115, where a body contact region is formed. Referring to the example illustrated in FIG. 16, a body contact region 24 is formed in the P-type region 112 and is disposed adjacent to the source region 22 so that the source region 22 is disposed between the body contact region 24 and the poly gate 19'. In some embodiments, the body contact region 24 is formed by doping the P-type region 112 with a P-type dopant (P+), for example, but not limited to, boron, gallium, aluminum, or indium, through another patterned photoresist layer (not shown) disposed over the substrate 11. The patterned photoresist layer is removed after the body contact region 24 is formed.

Figure 11:
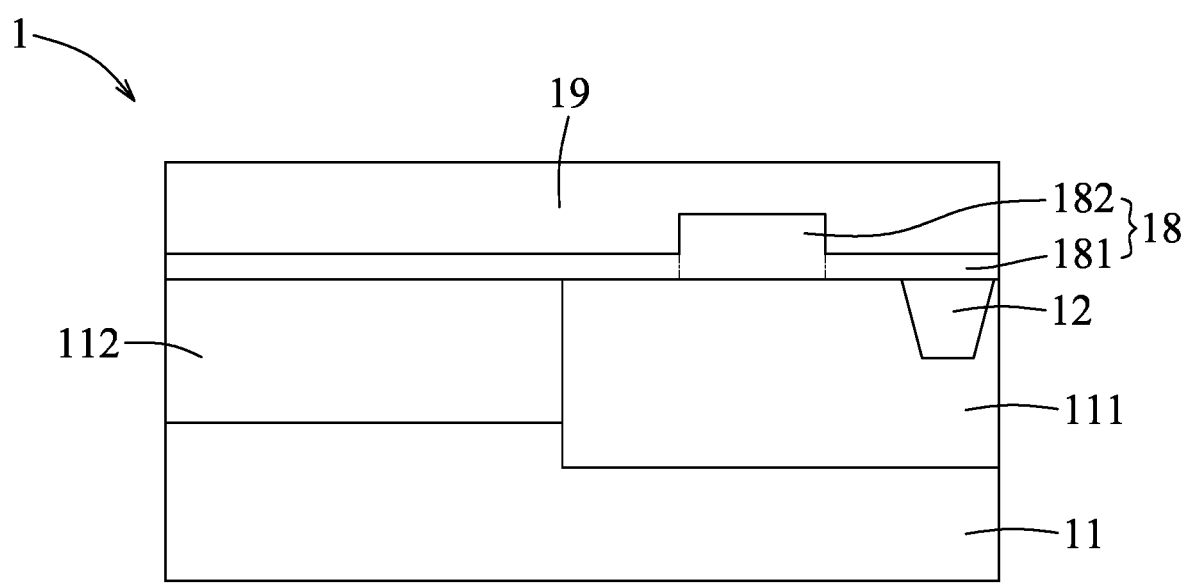
Figure 12:
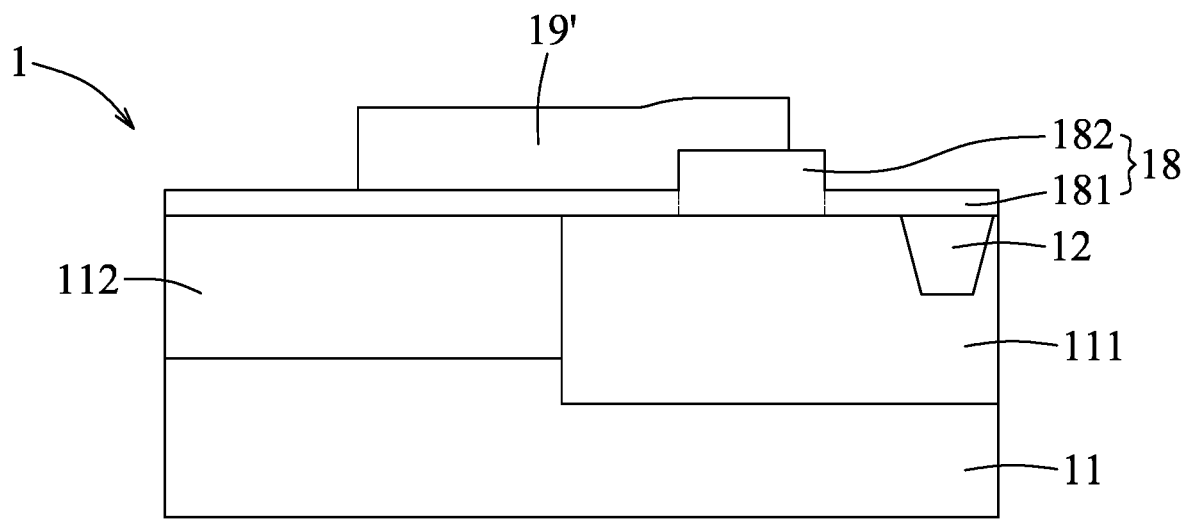
Figure 13:
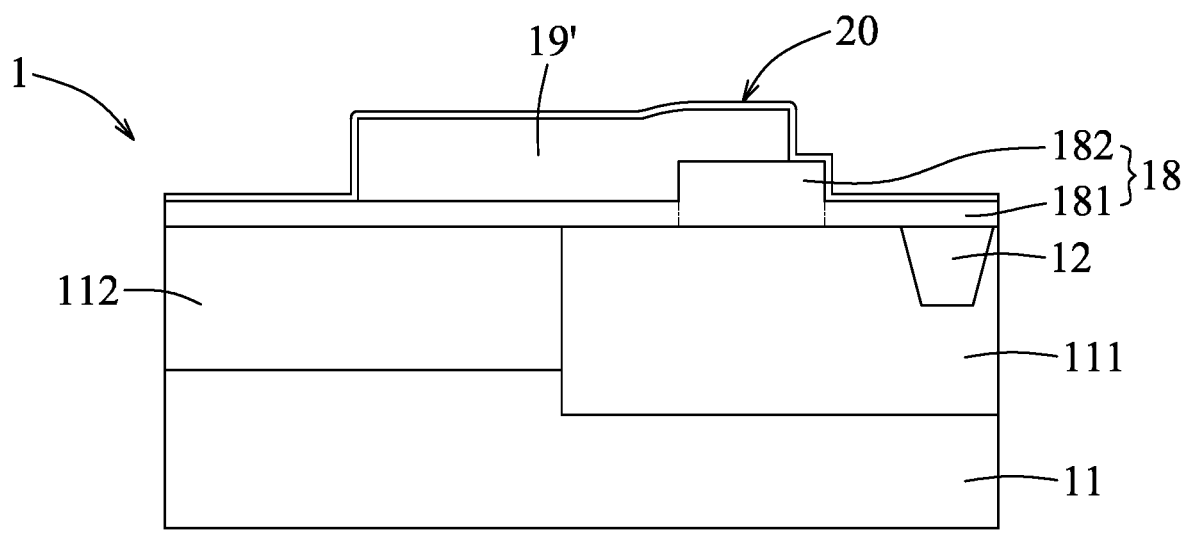
Figure 14:
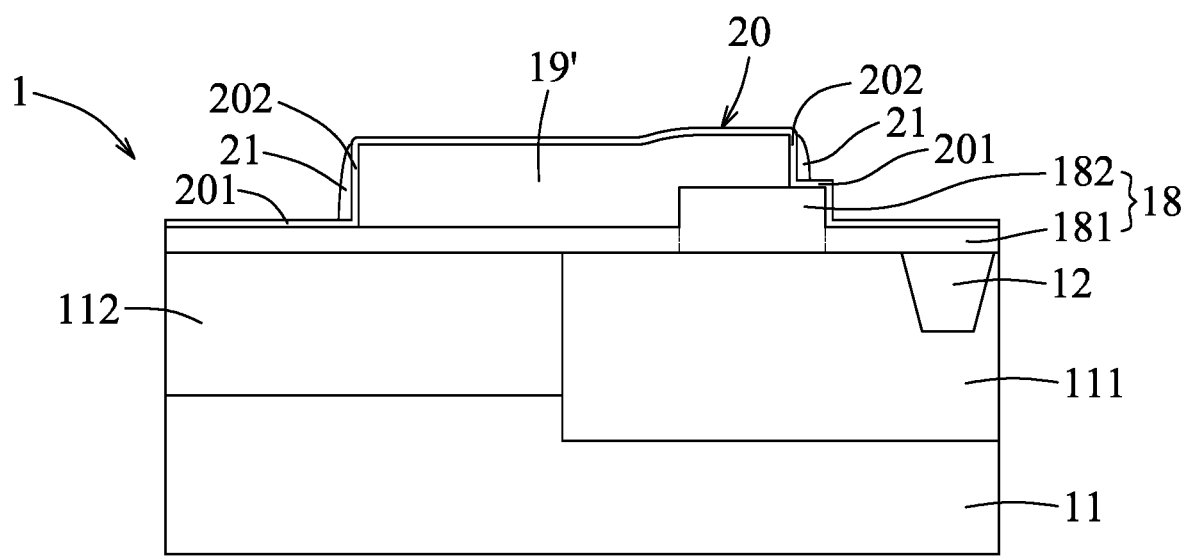
Figure 15:
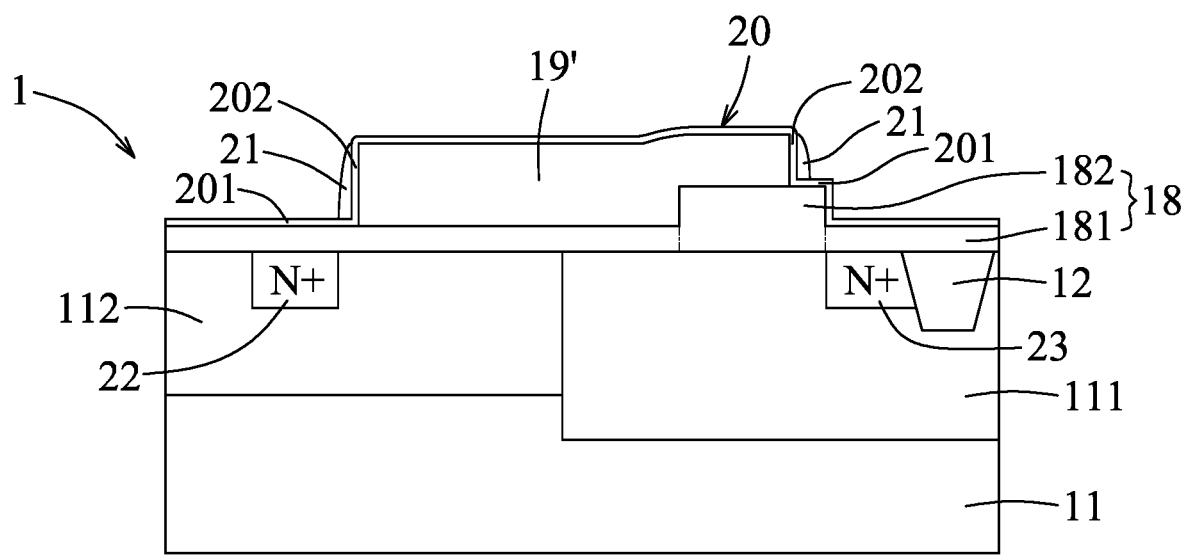
Figure 16:
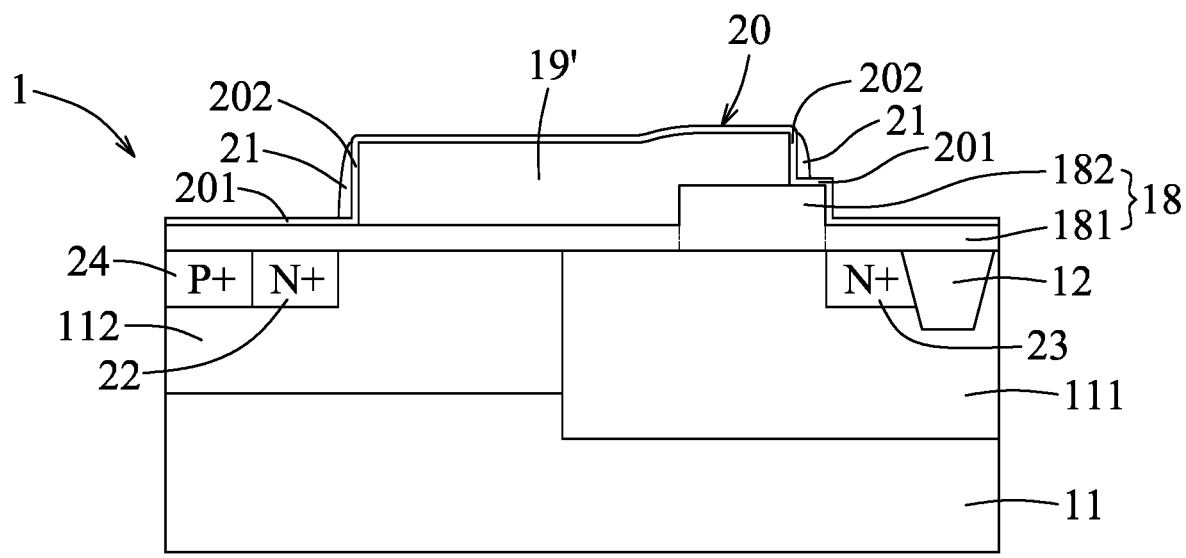
Figure 17:
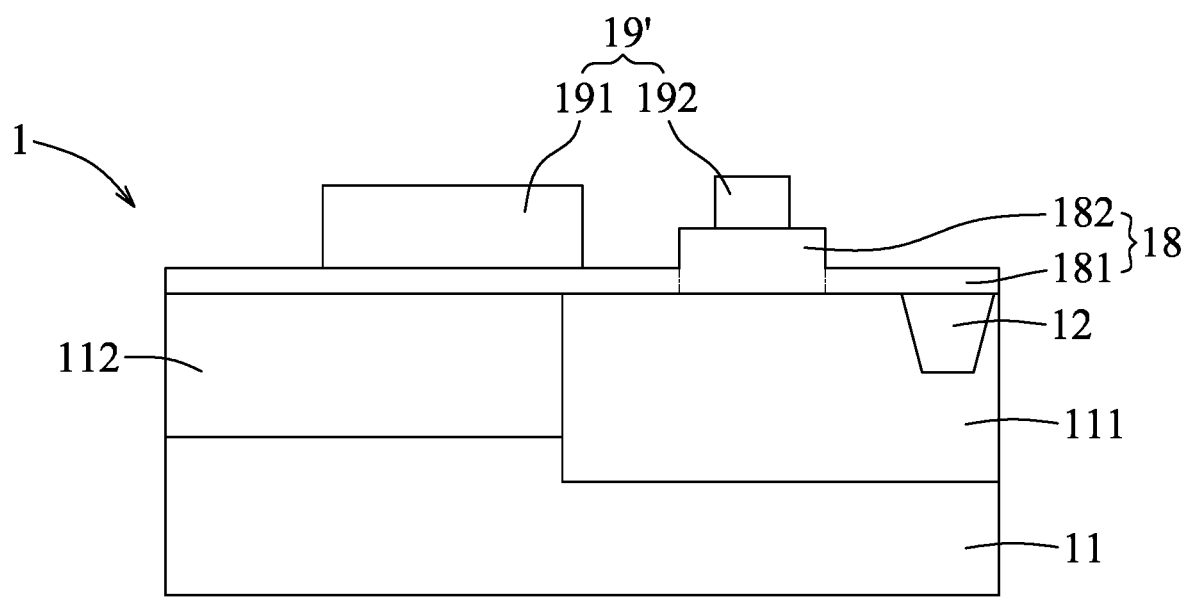

Referring to the examples illustrated in FIGS. 11 and 17, in some embodiments where a split gate LDMOS is to be formed, a hard mask layer (not shown) is patterned using photolithography and photoresist developing technology as known to those skilled in the art of semiconductor fabrication. For example, the hard mask layer may be patterned using the 193-nm immersion lithography or the EUV lithography. The pattern formed in the hard mask layer is then transferred to the polysilicon layer 19 using an etching process (for example but not limited to, dry etching) to form at least one poly gate 19', which includes a first poly gate portion 191 disposed on the I/O oxide layer portion 181 of the fully oxidized gate oxide layer 18 and a second poly gate portion 192 disposed on the fully oxidized ROX layer portion 182 of the fully oxidized gate oxide layer 18.

Figure 18:
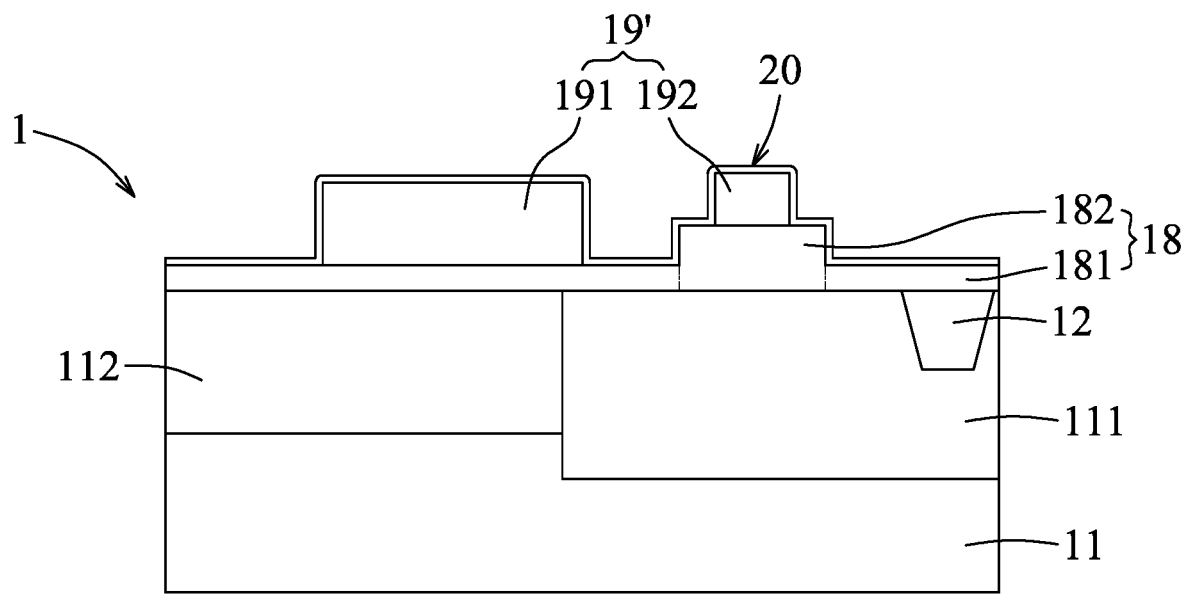

Referring to the block 112 of FIG. 1 and the example illustrated in FIG. 18, a dielectric buffer layer 20, for example, but not limited to, a dielectric silicon oxide layer, is conformally deposited to cover the first poly gate portion 191 and the second poly gate portion 192 of the poly gate 19', and the fully oxidized gate oxide layer 18. The deposition of the dielectric buffer layer 20 may be performed using a suitable deposition process as is known to those skilled in the art of semiconductor fabrication, for example, but not limited to, CVD, PECVD, ALD, PEALD, ALD, or PEALD. Other suitable deposition processes are within the contemplated scope of the present disclosure. The dielectric buffer 120 thus formed has a thickness ranging, for example, but not limited to, from 10 Å to 20 Å. Other suitable thickness is within the contemplated scope of the present disclosure.

Figure 19:
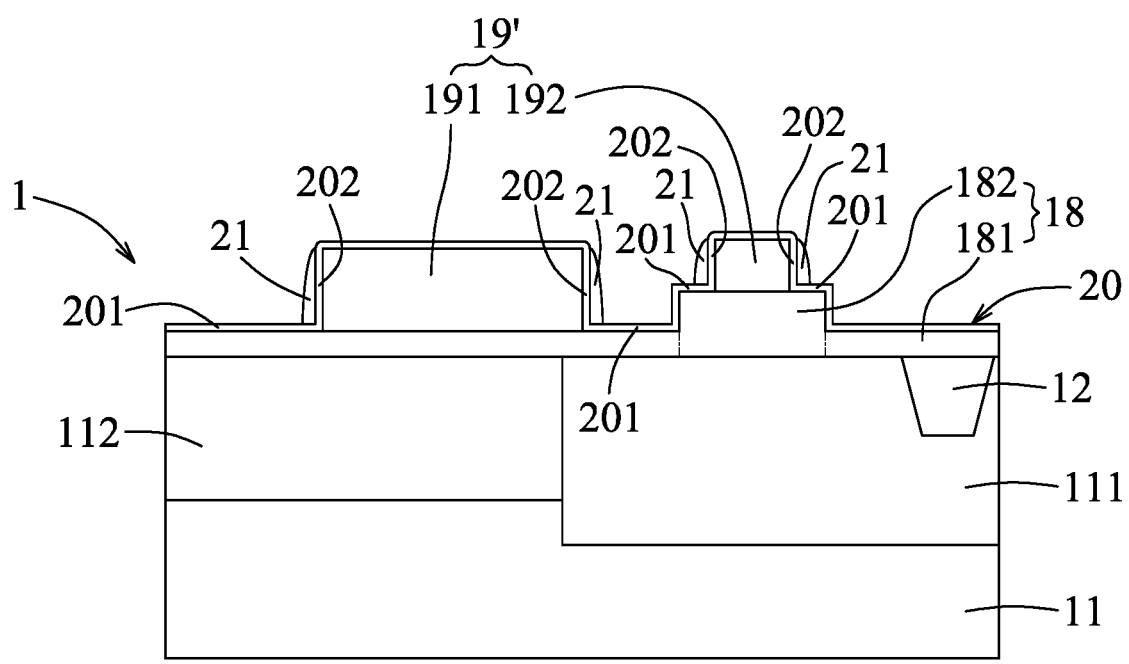

Referring to the block 113 of FIG. 1 and the example illustrated in FIG. 19, a plurality of sidewall spacers 21 are formed to extend upwardly from horizontal portions 201 of the dielectric buffer layer 20 and to laterally cover vertical portions 202 of the the dielectric buffer layer 20. In some embodiments, the sidewall spacers 21 are formed by conformally depositing a spacer layer on the dielectric buffer layer 20 and anisotropically etching the spacer layer to etch away horizontal portions of the spacer layer so as to form the sidewall spacers 21. The conformal deposition of the spacer layer may be performed using a suitable deposition process as known to those skilled in the art of semiconductor fabrication, for example, but not limited to, CVD, PECVD, ALD, PEALD, ALD, or PEALD. Other suitable deposition processes are within the contemplated scope of the present disclosure. In some embodiments, the spacer layer may be made of a dielectric material, for example, but not limited to, silicon oxide, silicon nitride, silicon carbide, silicon oxycarbide, silicon oxynitride, silicon carbonitride, silicon oxycarbonitride, or combinations thereof. Other suitable dielectric materials are within the contemplated scope of the present disclosure.

Figure 20:
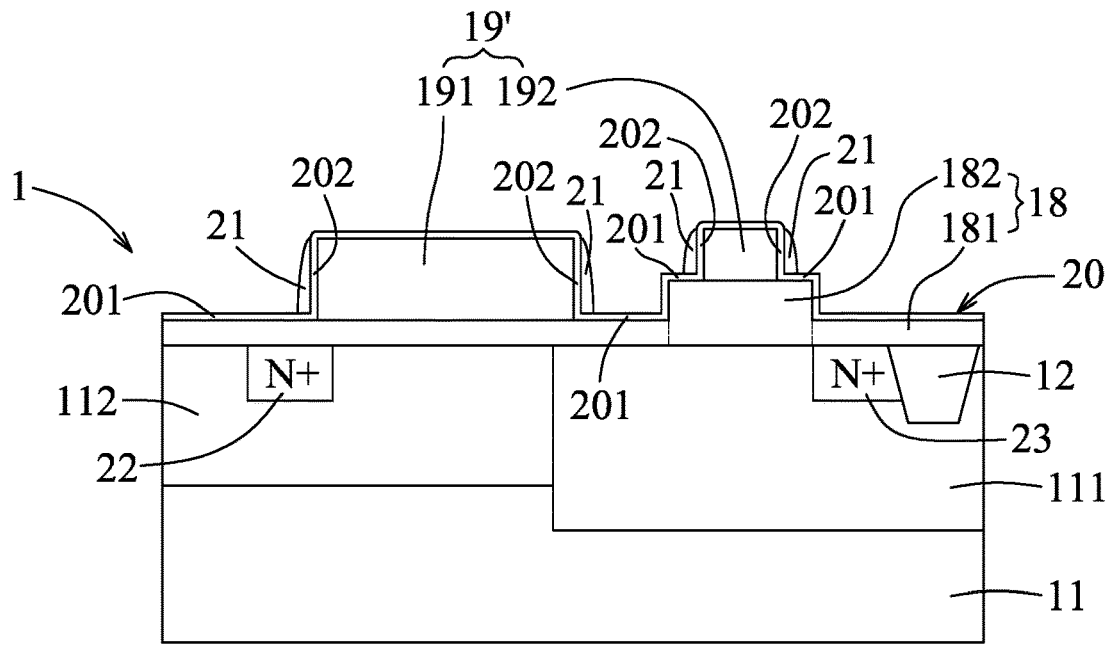

Referring to the block 114 of FIG. 1 and the example illustrated in FIG. 20, a source region 22 and a drain region 23 are formed in the P-type region 112 and the N-well region 111, respectively. The source region 22 is disposed adjacent to the first poly gate portion 191 of the poly gate 19', and the drain region 23 is disposed between the fully oxidized ROX layer portion 182 of the fully oxidized gate oxide layer 18 and the STI 12. In some embodiments, the source region 22 and the drain region 23 are formed simultaneously by doping the P-type region 112 and the N-well region 111 with an N-type dopant (N+), for example, but not limited to, phosphorous or arsenic, through a patterned photoresist layer (not shown) disposed over the substrate 11 for obtaining an N-channel LDMOS device. The patterned photoresist layer is removed after the source region 22 and the drain region 23 are formed. In some embodiments, the the source region 22 and the drain region 23 may have different structures, for example, but not limited to, raised, recessed, or strained features.

Figure 21:
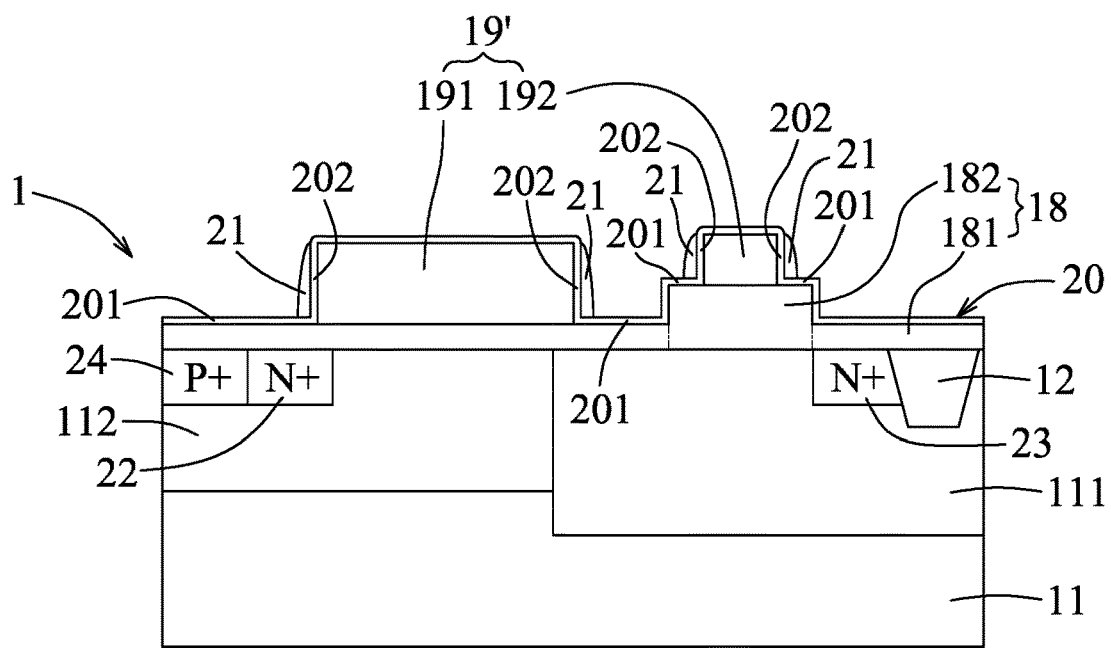

Referring to the block 115 of FIG. 1 and the example illustrated in FIG. 21, a body contact region 24 is formed in the P-type region 112 and is disposed adjacent to the source region 22 and opposite to the first poly gate portion 191 of the poly gate 19'. In some embodiments, the body contact region 24 is formed by doping the P-type region 112 with a P-type dopant (P+), for example, but not limited to, boron, gallium, aluminum, or indium, through another patterned photoresist layer (not shown) disposed over the substrate 11. The patterned photoresist layer is removed after the body contact region 24 is formed.

As described above, in the present disclosure, the patterned silicon oxynitride layer 14' is fully oxidized to form the fully oxidized gate oxide layer 18 on the substrate 11. Since the method 100 of the present disclosure does not involve using the wet etching process with the phosphoric acid and the aqueous solution of hydrofluoric acid which are usually employed in the method for making a field oxide isolation structure for a semiconductor device such as a LDMOS device, the surface damages on the substrate 11 are totally avoided.

In accordance with some embodiments of the present disclosure, a method for making a semiconductor device includes forming a ROX layer on a substrate and a patterned silicon oxynitride layer on the patterned ROX layer; conformally forming a dielectric oxide layer to cover the substrate, the patterned silicon oxynitride layer, and the patterned ROX layer; and fully oxidizing the patterned silicon oxynitride layer to form a fully oxidized gate oxide layer on the substrate.

In accordance with some embodiments of the present disclosure, the dielectric oxide layer is conformally formed using a rapid thermal oxidation process.

In accordance with some embodiments of the present disclosure, the rapid thermal oxidation process is conducted at a temperature ranging from 900° C. to 1150° C. for a time period ranging from 1 minute to 2 minutes.

In accordance with some embodiments of the present disclosure, the patterned silicon oxynitride layer is fully oxidized by further conducting the rapid thermal oxidation process after forming the dielectric oxide layer.

In accordance with some embodiments of the present disclosure, the rapid thermal oxidation process is further conducted at a temperature ranging from 900° C. to 1150° C. for a time period ranging from 1 minute to 2 minutes.

In accordance with some embodiments of the present disclosure, the dielectric oxide layer includes silicon oxide and has a thickness ranging from 10 Å to 20 Å.

In accordance with some embodiments of the present disclosure, the fully oxidized gate oxide layer is formed to include an input/output (I/O) oxide layer portion and a fully oxidized ROX layer portion integrated with the I/O oxide layer portion.

In accordance with some embodiments of the present disclosure, a thickness ratio of the fully oxidized ROX layer portion to the I/O oxide layer portion is at least 1.5.

In accordance with some embodiments of the present disclosure, the thickness ratio of the fully oxidized ROX layer portion to the I/O oxide layer portion ranges from 2.0 to 2.5.

In accordance with some embodiments of the present disclosure, the patterned ROX layer and the patterned silicon oxynitride layer are formed by forming a ROX layer on the substrate; sequentially depositing a silicon oxynitride layer, a bottom anti-reflective coating (BARC) layer, and a photoresist layer on the ROX layer; patterning the photoresist layer to form a patterned photoresist layer; patterning the BARC layer, the silicon oxynitride layer, and the ROX layer through the patterned photoresist layer to simultaneously form the patterned ROX layer, the patterned silicon oxynitride layer disposed on the patterned ROX layer, and a patterned BARC layer disposed on the patterned silicon oxynitride layer; and removing the patterned photoresist layer and the patterned BARC layer.

In accordance with some embodiments of the present disclosure, the ROX layer includes silicon oxide and has a thickness ranging from 120 Å to 130 Å.

In accordance with some embodiments of the present disclosure, the silicon oxynitride layer has a thickness ranging from 160 Å to 200 Å.

In accordance with some embodiments of the present disclosure, a semiconductor device includes a substrate and a fully oxidized gate oxide layer. The substrate includes a well region and a body region. The fully oxidized gate oxide layer is disposed on the substrate, and includes an I/O oxide layer portion and a fully oxidized ROX layer portion integrated with the I/O oxide layer portion. A thickness ratio of the fully oxidized ROX layer portion to the I/O oxide layer portion is at least 1.5.

In accordance with some embodiments of the present disclosure, the thickness ratio of the fully oxidized ROX layer portion to the I/O oxide layer portion ranges from 2.0 to 2.5.

In accordance with some embodiments of the present disclosure, the fully oxidized ROX layer portion and the I/O oxide layer portion include silicon oxide.

In accordance with some embodiments of the present disclosure, the fully oxidized ROX layer portion is disposed on the well region.

In accordance with some embodiments of the present disclosure, the semiconductor device further includes a poly gate disposed on the I/O oxide layer portion and the fully oxidized ROX layer portion; a source region disposed in the body region and adjacent to the poly gate; a drain region disposed in the well region and adjacent to the fully oxidized ROX layer portion; and a body contact region disposed in the body region and adjacent to the source region so that the source region is disposed between the body contact region and the poly gate.

In accordance with some embodiments of the present disclosure, an LDMOS device includes a substrate, a fully oxidized gate oxide layer, a poly gate, a source region, a drain region, and a body contact region. The substrate includes a well region and a body region. The fully oxidized gate oxide layer is disposed on the substrate, and includes an I/O oxide layer portion and a fully oxidized ROX layer portion integrated with the I/O oxide layer portion and disposed on the well region. A thickness ratio of the fully oxidized ROX layer portion to the I/O oxide layer portion is at least 1.5. The poly gate is disposed on the I/O oxide layer portion and the fully oxidized ROX layer portion. The source region is disposed in the body region and adjacent to the poly gate. The drain region is disposed in the well region and adjacent to the fully oxidized ROX layer portion. The body contact region is disposed in the body region and adjacent to the source region so that the source region is disposed between the body contact region and the poly gate.

In accordance with some embodiments of the present disclosure, the thickness ratio of the fully oxidized ROX layer portion to the I/O oxide layer portion ranges from 2.0 to 2.5.

In accordance with some embodiments of the present disclosure, the fully oxidized ROX layer portion and the I/O oxide layer portion include silicon oxide.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for making a semiconductor device, comprising:

forming a patterned reduced surface field oxide (ROX) layer on a substrate and a patterned silicon oxynitride layer on the patterned ROX layer;

conformally forming a dielectric oxide layer to cover the substrate, the patterned silicon oxynitride layer, and the patterned ROX layer; and fully oxidizing the patterned silicon oxynitride layer to form a fully oxidized gate oxide layer on the substrate.

2. The method according to claim 1, wherein the dielectric oxide layer is conformally formed using a rapid thermal oxidation process.

3. The method according to claim 2, wherein the rapid thermal oxidation process is conducted at a temperature ranging from 900° C. to 1150° C. for a time period ranging from 1 minute to 2 minutes.

4. The method according to claim 2, wherein the patterned silicon oxynitride layer is fully oxidized by further conducting the rapid thermal oxidation process after forming the dielectric oxide layer.

5. The method according to claim 4, wherein the rapid thermal oxidation process is further conducted at a temperature ranging from 900° C. to 1150° C. for a time period ranging from 1 minute to 2 minutes.

6. The method according to claim 1, wherein the dielectric oxide layer includes silicon oxide and has a thickness ranging from 10 Å to 20 Å.

7. The method according to claim 1, wherein the fully oxidized gate oxide layer is formed to include an input/output (I/O) oxide layer portion and a fully oxidized ROX layer portion integrated with the I/O oxide layer portion.

8. The method according to claim 7, wherein a thickness ratio of the fully oxidized ROX layer portion to the I/O oxide layer portion is at least 1.5.

9. The method according to claim 8, wherein the thickness ratio of the fully oxidized ROX layer portion to the I/O oxide layer portion ranges from 2.0 to 2.5.

10. The method according to claim 1, wherein the patterned ROX layer and the patterned silicon oxynitride layer are formed by forming a ROX layer on the substrate;

sequentially depositing a silicon oxynitride layer, a bottom anti-reflective coating (BARC) layer, and a photoresist layer on the ROX layer;

patterning the photoresist layer to form a patterned photoresist layer;

patterning the BARC layer, the silicon oxynitride layer, and the ROX layer through the patterned photoresist layer to simultaneously form the patterned ROX layer, the patterned silicon oxynitride layer disposed on the patterned ROX layer, and a patterned BARC layer disposed on the patterned silicon oxynitride layer; and removing the patterned photoresist layer and the patterned BARC layer.

11. The method according to claim 10, wherein the ROX layer includes silicon oxide and has a thickness ranging from 120 Å to 130 Å.

12. The method according to claim 10, wherein the silicon oxynitride layer has a thickness ranging from 160 Å to 200 Å.

13. A method for making a semiconductor device, comprising:

forming a reduced surface field oxide (ROX) layer on a substrate using an in-situ steam generation process;

depositing a silicon oxynitride layer on the ROX layer;

patterning the ROX layer and the silicon oxynitride layer to form a patterned ROX layer on the substrate and a patterned silicon oxynitride layer on the patterned ROX layer;

conformally forming a dielectric oxide layer to cover the substrate, the patterned silicon oxynitride layer, and the patterned ROX layer; and fully oxidizing the patterned silicon oxynitride layer to form a fully oxidized gate oxide layer on the substrate.

14. The method according to claim 13, wherein the in-situ steam generation process is conducted at a temperature ranging from 300° C. to 800° C. and a pressure ranging from 5 Torr to 40 Torr.

15. The method according to claim 14, wherein the in-situ steam generation process is conducted by introducing oxygen at a total gas flow ranging from 5 standard liters per minute (s.l.m.) to 50 s.l.m. and hydrogen at a Hz % ranging from 2% to 33% for a process time ranging from 30 seconds to 10 minutes.

16. The method according to claim 13, wherein the dielectric oxide layer is conformally formed using a rapid thermal oxidation process conducted at a temperature ranging from 900° C. to 1150° C. for a time period ranging from 1 minute to 2 minutes.

17. The method according to claim 16, wherein the patterned silicon oxynitride layer is fully oxidized by further conducting the rapid thermal oxidation process at a temperature ranging from 900° C. to 1150° C. for a time period ranging from 1 minute to 2 minutes after forming the dielectric oxide layer.

18. A method for making a semiconductor device, comprising:

forming a reduced surface field oxide (ROX) layer on a substrate using an in-situ steam generation process;

depositing a silicon oxynitride layer on the ROX layer;

patterning the ROX layer and the silicon oxynitride layer to form a patterned ROX layer on the substrate and a patterned silicon oxynitride layer on the patterned ROX layer;

forming a dielectric oxide layer having a thickness ranging from 10 Å to 20 Å to cover the substrate, the patterned silicon oxynitride layer, and the patterned ROX layer; and fully oxidizing the patterned silicon oxynitride layer to form a fully oxidized gate oxide layer on the substrate, the fully oxidized gate oxide layer including an input/output (I/O) oxide layer portion and a fully oxidized ROX layer portion integrated with the I/O oxide layer portion, a thickness ratio of the fully oxidized ROX layer portion to the I/O oxide layer portion being at least 1.5.

19. The method according to claim 18, wherein the in-situ steam generation process is conducted by introducing oxygen at a temperature ranging from 300° C. to 800° C., a pressure ranging from 5 Torr to 40 Torr, and a total gas flow ranging from 5 standard liters per minute (s.l.m.) to 50 s.l.m., and hydrogen at a Hz % ranging from 2% to 33% for a process time ranging from 30 seconds to 10 minutes.

20. The method according to claim 18, wherein the dielectric oxide layer is conformally formed using a rapid thermal oxidation process conducted at a temperature ranging from 900° C. to 1150° C. for a time period ranging from 1 minute to 2 minutes, and the patterned silicon oxynitride layer is fully oxidized by further conducting the rapid thermal oxidation process at a temperature ranging from 900° C. to 1150° C. for a time period ranging from 1 minute to 2 minutes after forming the dielectric oxide layer.

* * * * *